United States Patent [19]
Hoon

[11] Patent Number: 6,104,221
[45] Date of Patent: Aug. 15, 2000

[54] POWER-UP DETECTION CIRCUIT OF A SEMICONDUCTOR DEVICE

[75] Inventor: Ryu Hoon, Kyunggi-do, Rep. of Korea

[73] Assignee: Samsung Electronics, Co., Ltd., Suwon, Rep. of Korea

[21] Appl. No.: 09/019,518

[22] Filed: Feb. 5, 1998

[30] Foreign Application Priority Data

Feb. 5, 1997 [KR] Rep. of Korea ......................... 97-3589

[51] Int. Cl.[7] ...................................................... H03L 7/00
[52] U.S. Cl. ................... 327/143; 327/77; 327/81
[58] Field of Search ..................... 327/81, 80, 77, 327/143, 78, 198, 321, 323

[56] References Cited

U.S. PATENT DOCUMENTS

| | | | |
|---|---|---|---|
| 5,013,935 | 5/1991 | Mahabadi | 327/78 |
| 5,144,159 | 9/1992 | Frisch et al. | 327/198 |
| 5,469,100 | 11/1995 | Wuidart et al. | 327/262 |
| 5,581,206 | 12/1996 | Chevallier et al. | 327/143 |

*Primary Examiner*—Timothy P. Callahan
*Assistant Examiner*—An T. Luu
*Attorney, Agent, or Firm*—Marger Johnson & McCollom, PC

[57] ABSTRACT

Disclosed is a power-up detection circuit of a semiconductor device which generates an output signal enabling an activation of the semiconductor device to be maintained only when an internal power voltage is more than a predetermined voltage level. In the power-up detection circuit, a level detection section is provided for detecting a level of the internal power voltage to generate a first level detection signal when the internal power voltage is less than the predetermined voltage level and to generate a second level detection signal when the internal power voltage is not less than the predetermined voltage level. And, an output driver is provided for enabling the internal circuits to be at inactive state in response to the first level detection signal, and generating the output signal having the same waveform as the internal power voltage in response to the second level detection signal.

13 Claims, 5 Drawing Sheets

POWER-UP DETECTION CIRCUIT OF A SEMICONDUCTOR DEVICE

BACKGROUND OF THE INVENTION

1. Field of the Invention

The present invention relates to a power-up detection circuitry, and more particularly, to a power up detection circuit included in a semiconductor device which provides a stable power-up operation.

2. Description of the Related Art

When semiconductor devices such as semiconductor memory devices are powered on, such devices begin to operate only when an internal power supply voltage is greater than a predetermined voltage level ensuring stable operation. This function is performed by a power-up detection circuit. The power-up detection circuit provides an output signal to the internal circuits of the device, e.g., input/output circuits. Namely, when the internal power supply voltage is greater than a predetermined voltage level, the power-up detection circuit enables the memory device by activating an output signal VCCH.

Typically, stable operation of a semiconductor memory device cannot be ensured in a prior art power-up detection circuit when the internal power supply voltage VINT supplied to the device is less than a predetermined voltage level Va, as shown in FIGS. 1A and 1B. In particular, many semiconductor memory devices require a low voltage for their self-refresh operations. In those devices, it is impossible to set the predetermined voltage level Va to a higher level. For example, the output signal VCCH of the power-up detection circuit continues to be active during operation of the memory device, but it may become inactive due to the internal power supply voltage VINT dropping down to less than the predetermined voltage level Va to reduce power consumption during the self-refresh operation (shown by $t_{SR}$ in FIG. 1B). When this happens, master clocks such as the row address strobe signal /RAS become inactive causing discontinuous operation when the device is released from the self-refresh operation.

One solution to the above-mentioned problem is a power-up detection circuit having the operational characteristics shown in FIGS. 2A and 2B. It can be seen from FIGS. 2A and 2B that the output signal VCCH of the prior art power-up detection circuit becomes active when the internal power supply voltage is more than a first predetermined voltage level Va' and that the output signal VCCH becomes inactive when the internal power supply voltage VINT is less than a second predetermined voltage level Vi. In this circuit, however, the internal power supply voltage VINT fluctuates as shown in FIG. 2B. The internal power supply voltage might also drop down during a low-voltage mode such as the self-refresh operation (shown by $t'_{SR}$ in FIG. 2B). If the internal power supply voltage VINT temporarily drops to less than the second predetermined voltage level Vi, the memory device can prematurely end the self-refresh operation.

SUMMARY OF THE INVENTION

An object of the present invention is to overcome the disadvantages associated with prior art power-up detection circuits.

Another object of the present invention is to provide a power-up detection circuit for a semiconductor device in which an output signal which enables internal circuits of the device is maintained in an enabled state even though the internal power voltage changes.

According to one aspect of the present invention, a power-up detection circuit for a semiconductor device is provided. The power-up detection circuit comprises a level detection section for generating a detection signal having a first voltage level when an internal power voltage is less than a predetermined voltage level and for generating a detection signal having a second voltage level when the internal power voltage is greater than or equal to the predetermined voltage level. The power-up detection circuit further comprises an output driver for enabling the internal circuits in response to the detection signal having the first voltage level and for generating an output signal having a waveform which is the same as the waveform of the internal power voltage responsive to the detection signal having the second voltage level.

The level detection section comprises a first switching means for controlling the supply of the internal power voltage responsive to the output signal; a level detector for detecting when the internal power voltage reaches the predetermined voltage level and for generating a level detector output signal responsive thereto; and an inverter circuit for generating the detection signal by inverting the level detector output signal.

The output driver comprises an output buffer for buffering the detection signal and a second switching means coupled to the output buffer for controlling supply of the detection signal to the output buffer in response to the output signal.

BRIEF DESCRIPTION OF THE DRAWINGS

The foregoing and other objects, features, and advantages will become more readily apparent from the following detailed description of a preferred embodiment which proceeds with reference to the drawings.

DETAILED DESCRIPTION OF PREFERRED EMBODIMENT

Figure 1A:
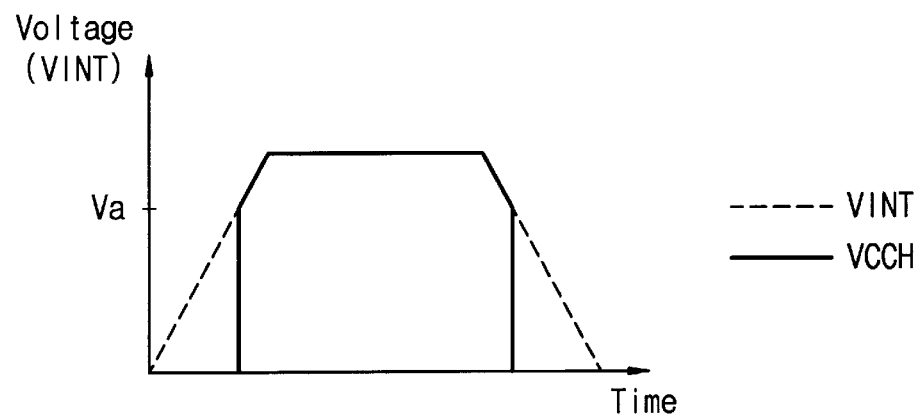
FIGS. 1A and 1B are timing diagrams showing the operational characteristics of a prior art power-up detection circuit.
Figure 1B:
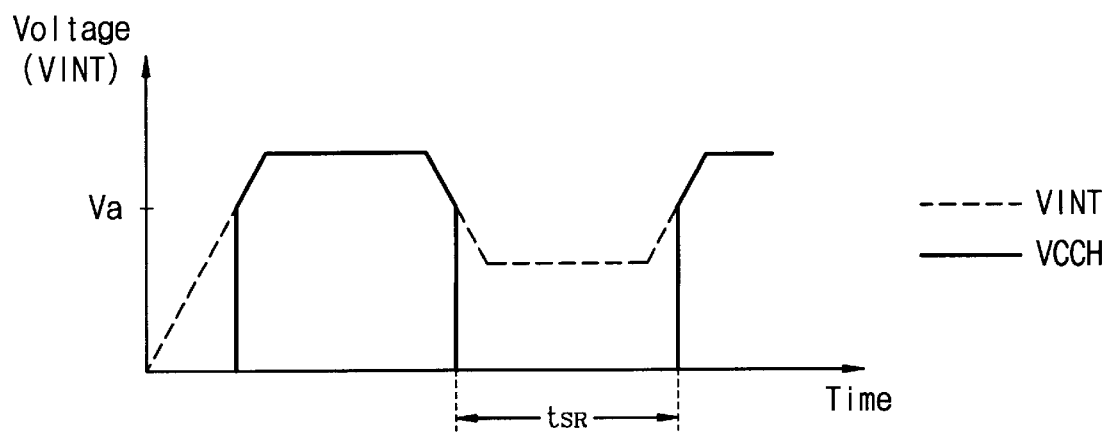
Figure 2A:
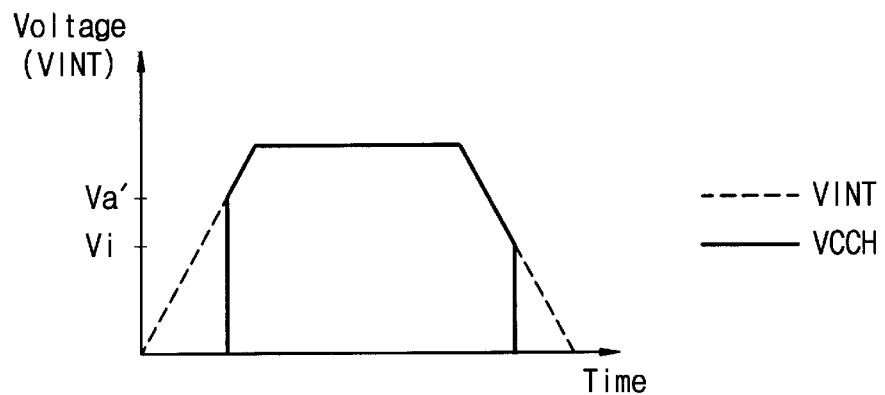
FIGS. 2A and 2B are timing diagrams showing the operational characteristics of a second prior art power-up detection circuit.
Figure 2B:
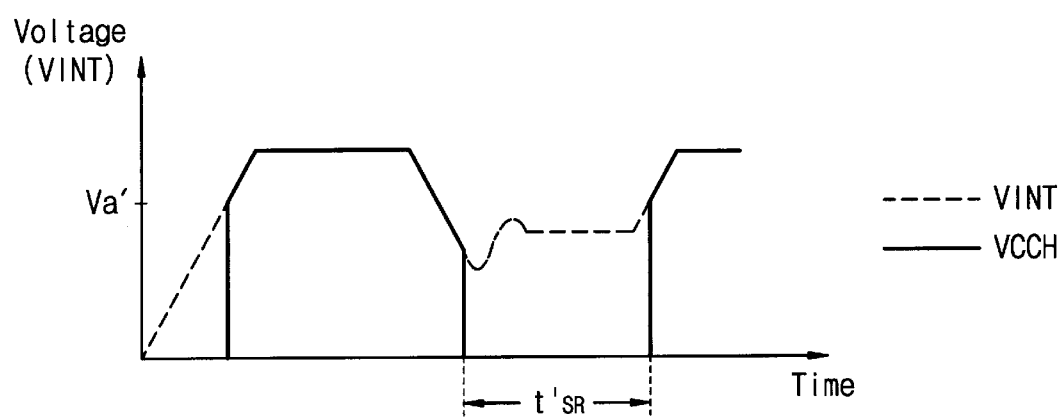
Figure 3:
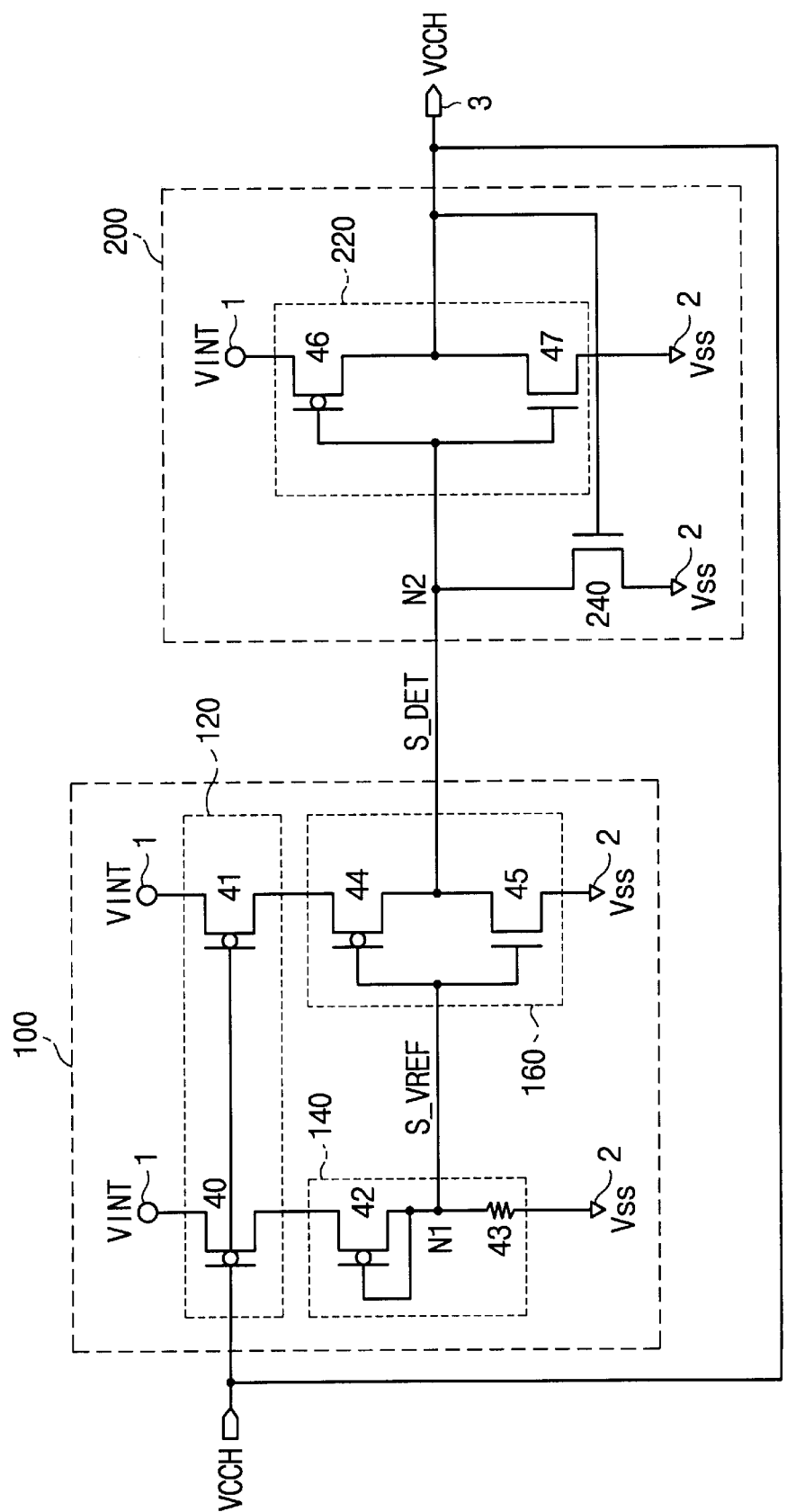
FIG. 3 is a circuit diagram of a power-up detection circuit according to an embodiment of the present invention.

FIG. 3 shows the power-up detection circuit according to the present invention. Referring to FIG. 3, the power-up detection circuit comprises a level detection section 100 and an output driver 200. The power-up detection circuit generates a low level output signal VCCH when the internal power supply voltage VINT reaches a predetermined voltage level Va. The predetermined voltage level Va is preferably between about 2.2 V~3.3 V. While the output signal VCCH is maintained at a low level, internal circuits in the semiconductor memory device are set to an initial state during the power-up operation.

The power-up detection circuit also generates an output signal VCCH having the same waveform as the input voltage VINT when the input voltage reaches the predetermined voltage level Va. The output signal VCCH is then fedback from the output driver 200 to the level detection section 100 to disable the level detection section 100. By doing so, current consumption in the level detection section 100 is considerably reduced.

The NMOS transistor 240 functions as a switch and is activated by the signal VCCH to allow an input node of the output buffer 220 to be at a low level. Thus, the output buffer 220 and the NMOS transistor 240 function as a latch circuit for enabling the output signal VCCH to continuously have the same waveform as the input voltage VINT. Since the output signal VCCH varies according to the waveform of the input voltage VINT, the output signal VCCH is in an inactive state only during the time that the input voltage VINT is in an off-state. Thus, even though the input voltage VINT drops down to a low level during the self-refresh operation of the semiconductor memory device, the master clock is in an inactive state according to the inactive state of the output signal VCCH which prevents device malfunctions.

Turning to FIG. 3, the level detection section 100 of the power-up detection circuit generates a high level detection signal S_DET when the internal power supply voltage VINT is less than the predetermined voltage level Va. The level detection section 100 generates a low level detection signal S_DET when the internal power supply voltage VINT is greater than or equal to the predetermined voltage level Va. The level detection section 100 includes a switching part 120, a level detector 140, and an inverter circuit 160.

The switching part 120 comprises two PMOS enhancement type transistors 40 and 41. The switching part 120 allows a current to flow through the PMOS transistor 40 to the level detector 140 responsive to the output signal VCCH fedback from the output driver 200 when the internal power voltage VINT is applied to the power-up detection circuit. If the output signal VCCH is at a low level, the PMOS transistors 40 and 41 of the switching part 120 become active. If the output signal VCCH is at a high level, the PMOS transistors 40 and 41 of the switching part 120 becomes inactive.

The level detector 140 includes an active load 42 and a resistor 43. Active load 42 is serially connected to resistor 43. The level detector 140 generates a detection signal S_VREF depending on the amount of current flowing through the PMOS transistor 40. The active load 42 is preferably a PMOS transistor having a gate and a drain commonly connected to the node N1 and a source connected to the drain of the PMOS transistor 40. When the internal power supply voltage VINT is initially applied, since the turn-on resistance of the active load 42 is very large, the detection signal S_VREF is at a low level. As the internal power supply voltage VINT is gradually increased, the turn-on resistance of the active load 42 is gradually decreased so that most of the voltage VINT is across the resistor 43 the detection signal S_VREF changes to a high level.

The inverter circuit 120 includes a pull-up PMOS transistor 44 and a pull-down NMOS transistor 45. The inverter circuit 120 inverts the level of the detection signal S_VREF and provides the inverted S_VREF signal to the node NZ as the level detection signal S_DET.

The output driver 200 includes an output buffer 220 and a switching NMOS transistor 240. The output driver 200 generates a low level output signal VCCH when the level detection signal S_DET provided by the level detection section 100 is at a high level. The output driver 200 also generates the output signal VCCH which has the same waveform as the internal power supply voltage VINT when the level detection signal S_DET is at a low level, and at the same time disabling the level detection section 100.

The output buffer 220 includes a CMOS inverter which has a pull-up PMOS transistor 46 and a pull-down NMOS transistor 47. The switching NMOS transistor 240 connects the input node of the output buffer 220 to a ground terminal 2 to which a ground voltage Vss is applied when the output signal VCCH having the same waveform as the voltage VINT is applied. In this case, the output buffer 220 and the switching NMOS transistor 240 function as a latch circuit.

Figure 4:
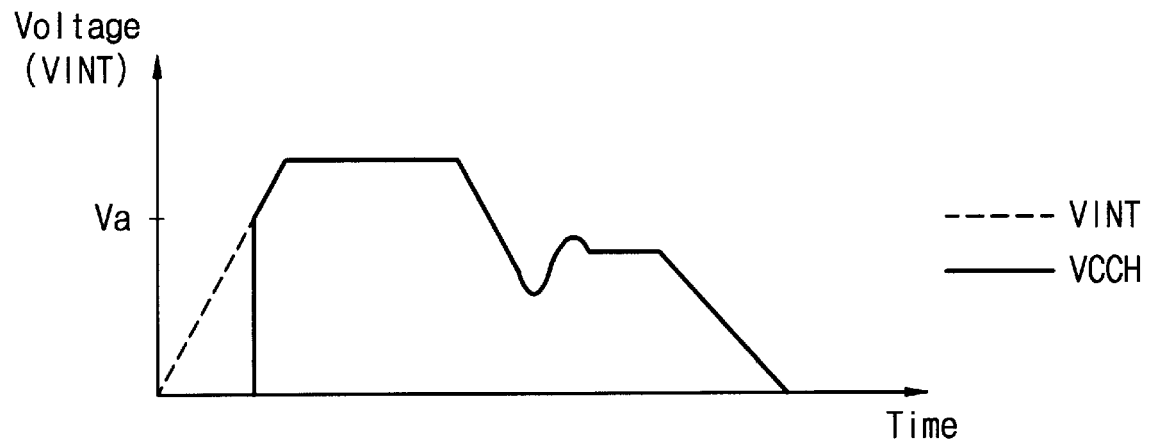
FIG. 4 is a timing diagram showing the operational characteristics of the power-up detection circuit shown in FIG. 3.
Figure 5A:
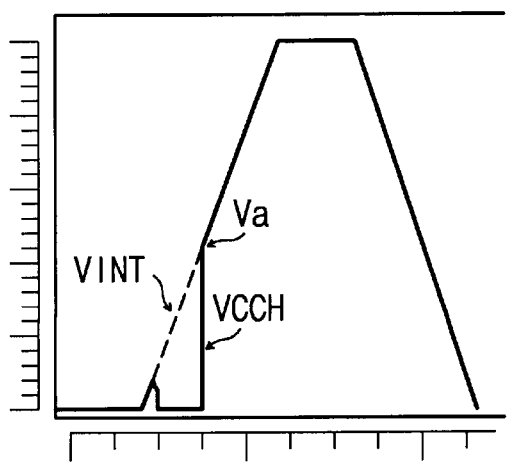
FIGS. 5A and 5B are diagrams showing the voltage level variation of the level detector and inverter circuit shown in FIG. 3.
Figure 5B:
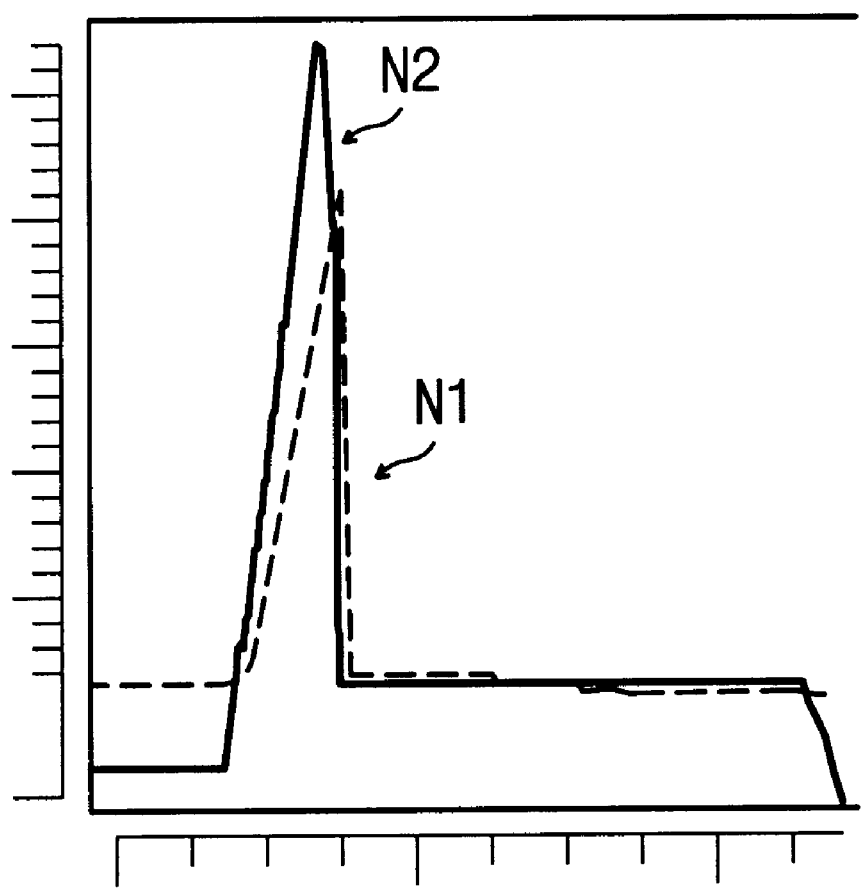

FIG. 4 is a timing diagram showing the operational characteristics of the power-up detection circuit shown in FIG. 3. FIGS. 5A and 5B are timing diagrams showing the voltage level variation of the level detector and inverter circuit of FIG. 3. The operation of the power-up detection circuit according to the present invention will be described with reference to FIGS. 4, 5A, and 5B.

Referring to FIG. 3, when the internal power supply voltage VINT is initially applied as shown in FIG. 4, the output signal VCCH of the output driver 200 is at a low level. Thus, the level detection section 100 is in an active state. During this time, the PMOS transistors 40 and 41 of the switching part 120 are turned on by the low level output signal VCCH and a current signal starts to flow through the PMOS transistor 40 to the level detector 140. Since the turn-on resistance of the active load 42 is large, the reference power voltage S_VREF is at a low level. A low level reference power voltage S_VREF turns on the pull-up PMOS transistor 44 of the inverter circuit 160 causing the level detection signal S_DET to track the waveform of the internal power supply voltage VINT. Thereafter, the NMOS transistor 47 of the output buffer 220 is turned on causing the output signal VCCH to change to a low level signal. Also, as the internal power supply voltage VINT is gradually increased as depicted by the dotted line shown in FIG. 4, the turn-on resistance of the active load 42 is gradually decreased causing the node NI to change from a low level to a high level.

In other words, if the internal power supply voltage VINT reaches the predetermined voltage level Va as shown in FIG. 4, the voltage level at node N1 becomes more than the threshold voltage level of the NMOS transistor 45 turning on the NMOS transistor 45. Thereafter, the input terminal of the output buffer 220 changes to a low level turning on the PMOS transistor 46 of the output buffer 200. As a result, the output signal VCCH at the output terminal 3 of the output driver 200 changes to a high level and has the same waveform as the internal power supply voltage VINT. The high level output signal VCCH, as shown in FIG. 4, is fedback to the switching part 120 disabling the switching part 120. The disabling of the switching part 120 decreases current consumption. Also, when the output signal VCCH is at a high level, the NMOS transistor 240 is turned on and the input of the output buffer 220 is at a ground voltage Vss, i.e., at a low level.

In other words, if the output signal VCCH has the same waveform as the internal power supply voltage VINT, the input of the output buffer 220 is latched to a low level by the latch circuit formed by the output buffer 220 and the NMOS transistor 240. Even though the internal power supply voltage VINT is decreased to a low level by noise or during the self-refresh operation, the output signal VCCH of the output driver 200 is not inactive. The above-described operation results in low power consumption.

According to the power-up detection circuit of the present invention, the output signal of an output driver thereof continues to be at a low level when an internal power voltage is less than the predetermined voltage level allowing internal circuits thereof to be set to an initial state even during an initial stage of the power-up operation.

After the internal power supply voltage reaches the predetermined voltage level, the power-up detection circuit generates an output signal having the same waveform as the internal power supply voltage. The output signal is fedback to disable the level detection section thereof. Therefore, current consumption of the level detection section is prevented and overall power consumption is reduced.

Furthermore, an input of the output buffer in the output driver is latched to a low level responsive to the output signal having the same waveform as the internal power supply voltage. Thus, even though the internal power supply voltage is lowered to a low voltage level due to noise or during the self-refresh operation, the output signal of the power-up detection circuit continues to be active. Therefore, it is possible to prevent device malfunctions.

What is claimed is:

1. A power-up detection circuit for a semiconductor device, comprising:
   a level detection section for generating a detection signal having a first voltage level when an internal power voltage is less than a predetermined voltage level and for generating a detection signal having a second voltage level when the internal power voltage is greater than or equal to the predetermined voltage level; and
   an output driver for generating an output signal having a waveform which is the same as a waveform of the internal power voltage in response to the detection signal having the second voltage level such that internal circuits are enabled by the output signal;
   wherein the level detection section comprises:
      a first switching means for controlling supply of the internal power voltage in response to the output signal;
      a level detector for detecting when the internal power voltage reaches the predetermined voltage level and generating a level detector output signal in response thereto; and
      an inverter circuit for generating the detection signal by inverting the level detector output signal; and
   wherein the output driver comprises:
      an output buffer for buffering the detection signal, and a second switching means coupled to the output buffer for controlling supply of the detection signal to the output buffer in response to the output signal.

2. The power-up detection circuit of claim 1 wherein the level detector comprises an active load having a turn-on resistance, the turn-on resistance changing in accordance with a current flowing through the first switching means to the level detector, and a resistor connected in series between the active load and a ground terminal.

3. A power-up detection circuit, comprising:
   a level detection circuit for generating a detection signal responsive to an internal power supply voltage, the detection signal having a first voltage level when the internal power supply voltage is less than a predetermined voltage level and a second voltage level when the internal power supply voltage is greater than or equal to the predetermined voltage; and
   an output driver circuit for generating an output signal responsive to the detection signal, the output signal having a waveform that is the same as a waveform of the internal power supply voltage responsive to the detection signal having the second voltage level
   wherein the level detection circuit includes a switching circuit for providing the internal power supply voltage to a switching circuit output terminal responsive to the output signal; and
   wherein level detection circuit includes an active load circuit connected to an output terminal of the switching circuit for generating an active load output signal having a voltage level which varies according to a current flowing through the switching circuit.

4. The power-up detection circuit of claim 3 wherein the level detection circuit includes an input terminal for receiving the output signal.

5. The power-up detection circuit of claim 3 wherein the switching circuit includes two PMOS transistors, each PMOS transistor including a source, a gate for receiving the output signal, and a drain for receiving the internal power supply voltage.

6. The power-up detection circuit of claim 3 wherein the active load circuit includes an active load and a resistor, the resistor being serially connected between the active load and a ground terminal, the ground terminal for receiving a ground voltage.

7. The power-lip detection circuit of claim 3 wherein the level detection circuit includes an inverter circuit connected to an output terminal of the switching circuit and to an output terminal of the active load circuit for generating the detection signal by inverting the active load output signal.

8. The power-up detection circuit of claim 7 wherein the inverter circuit includes a PMOS transistor serially connected to an NMOS transistor, the PMOS transistor having a gate connected to a gate of the NMOS transistor for receiving the active load output signal.

9. The power-up detection circuit of claim 7 wherein the output driver circuit includes a buffer having an input terminal for receiving the detection signal and an output terminal for providing the output signal.

10. The power-up detection circuit of claim 9 wherein the buffer includes a PMOS transistor serially connected to an NMOS transistor, the PMOS transistor having a gate connected to a gate of the NMOS transistor for receiving the detection signal.

11. The power-up detection circuit of claim 9 wherein the output driver circuit includes a second switching circuit for providing the input terminal of the buffer with a ground voltage responsive to the output signal.

12. The power-up detection circuit of claim 11 wherein the second switching circuit includes an NMOS transistor having a gate for receiving the output signal, a source connected to a ground terminal for receiving a ground voltage, and a drain connected to the input terminal of the buffer.

13. A power-up circuit for a semiconductor memory device, comprising:

a first switching circuit for providing an internal power supply voltage to a first switching circuit output terminal responsive to an output signal;

an active load circuit coupled to the first switching circuit for generating an active load output signal, the active load output signal having a first voltage level when the internal power supply voltage is less than a predetermined level and a second voltage level when the internal power supply voltage is greater than or equal to the predetermined voltage level;

an inverter circuit for generating a detection signal by inverting the active load output signal;

a buffer circuit for receiving the internal power supply voltage and the detection signal and for generating the output signal; and a second switching circuit for providing a ground voltage to the inverter output terminal responsive to the output signal.

\* \* \* \* \*

UNITED STATES PATENT AND TRADEMARK OFFICE
CERTIFICATE OF CORRECTION

PATENT NO.    : 6,104,221
DATED         : August 15, 2000
INVENTOR(S)   : Hoon

It is certified that error appears in the above-identified patent and that said Letters Patent is hereby corrected as shown below:

Title page,
Item [57], delete ABSTRACT in its entirety and replace with the following:

-- Disclosed is a power-up detection circuit for a semiconductor device which generates an output signal for enabling the semiconductor device when an internal power voltage is greater than a predetermined voltage level. A level detection circuit is provided for generating a detection signal responsive to an internal power supply voltage, the detection signal having a first voltage level when the internal power supply voltage is less than a predetermined voltage level and a second voltage level when the internal power supply voltage is greater than or equal to the predetermined voltage. An output driver circuit is additionally included in the power-up detection circuit for generating an output signal responsive to the detection signal, the output signal having a waveform that is the same as a waveform of the internal power supply voltage responsive to the detection signal having the second voltage level. --

Column 4,
Line 58, "NI" should read -- N1 --.

Signed and Sealed this

Twenty-seventh Day of August, 2002

*Attest:*

*Attesting Officer*

JAMES E. ROGAN
*Director of the United States Patent and Trademark Office*